(12) United States Patent
Ma et al.

(10) Patent No.: US 11,812,554 B2
(45) Date of Patent: Nov. 7, 2023

(54) LAYOUT STRUCTURE OF A FLEXIBLE CIRCUIT BOARD

(71) Applicant: CHIPBOND TECHNOLOGY CORPORATION, Hsinchu (TW)

(72) Inventors: Yu-Chen Ma, Kaohsiung (TW); Hsin-Hao Huang, Kaohsiung (TW); Wen-Fu Chou, Kaohsiung (TW); Gwo-Shyan Sheu, Kaohsiung (TW)

(73) Assignee: CHIPBOND TECHNOLOGY CORPORATION, Hsinchu (TW)

( * ) Notice: Subject to any disclaimer, the term of this patent is extended or adjusted under 35 U.S.C. 154(b) by 477 days.

(21) Appl. No.: 17/227,458

(22) Filed: Apr. 12, 2021

(65) Prior Publication Data
US 2022/0104354 A1 Mar. 31, 2022

(30) Foreign Application Priority Data
Sep. 29, 2020 (TW) .................................. 109133774

(51) Int. Cl.
*H05K 1/11* (2006.01)
*H05K 1/18* (2006.01)

(52) U.S. Cl.
CPC ............. *H05K 1/118* (2013.01); *H05K 1/189* (2013.01); *H05K 2201/0979* (2013.01);
(Continued)

(58) Field of Classification Search
CPC ........... H01L 23/4985; H01L 23/49838; H01L 24/16; H01L 2224/16225; H01L 2924/351;
(Continued)

(56) References Cited

U.S. PATENT DOCUMENTS

2005/0139963 A1   6/2005  Kang et al.
2005/0218513 A1* 10/2005  Seko .................. H01L 24/29
                                                      257/E23.179
2019/0159342 A1*  5/2019  Oh ..................... H05K 1/0281

FOREIGN PATENT DOCUMENTS

CN      100440471 C    12/2008
JP      2001-135896 A   5/2001
(Continued)

OTHER PUBLICATIONS

Taiwanese Office Action dated May 11, 2021 for Taiwanese Patent Application No. 109133774, 5 pages.
(Continued)

*Primary Examiner* — Jonathan Han
(74) *Attorney, Agent, or Firm* — Demian K. Jackson; Jackson IPG PLLC

(57) ABSTRACT

A layout structure of flexible circuit board includes a flexible substrate, a chip and a circuit layer. A chip mounting area and a circuit area are defined on a top surface of the flexible substrate. The chip is mounted on the chip mounting area, a space exists between a first bump and a second bump of the chip, and there are no additional bumps between the first and second bumps. A first inner lead, a second inner lead, a first dummy lead and a second dummy lead of the circuit layer are located on the chip mounting area. The first and second inner leads are electrically connected to the first and second bumps respectively. The first dummy lead is connected to the first inner lead and adjacent to the first bump, and the second dummy lead is connected to the second inner lead and adjacent to the second bump.

10 Claims, 4 Drawing Sheets

(52) U.S. Cl.
CPC .............. *H05K 2201/09445* (2013.01); *H05K 2201/10674* (2013.01); *H05K 2201/10734* (2013.01)

(58) Field of Classification Search
CPC ......... H01L 24/32; H01L 24/73; H01L 24/81; H01L 24/92; H01L 2224/16227; H01L 2224/16238; H01L 2224/32225; H01L 2224/73204; H01L 2224/81203; H01L 2224/81385; H01L 2224/92125; H01L 2924/00; H05K 1/189; H05K 2201/10674; H05K 2201/10681; H05K 1/0271; H05K 2201/068; H05K 2201/09663; H05K 2201/09727; H05K 2201/0989; H05K 1/118; H05K 1/182; H05K 1/0281; H05K 2201/09445; H05K 2201/0979; H05K 2201/10734; H05K 2201/09781; H05K 1/111; G02F 1/136
See application file for complete search history.

(56) References Cited

FOREIGN PATENT DOCUMENTS

| | | |
|---|---|---|
| KR | 10-2006-0007775 A | 1/2006 |
| KR | 10-2008-0001512 A | 1/2008 |
| TW | 444521 | 7/2001 |
| TW | 201007912 A | 2/2010 |
| TW | M457965 | 7/2013 |
| TW | 201928482 A | 7/2019 |
| TW | I705748 B | 9/2020 |

OTHER PUBLICATIONS

Japanese Notice of Allowance dated May 17, 2022 for Japanese Patent Application No. 2021-033709, 3 pages.
Korean Notice of Allowance dated Dec. 6, 2022 for Korean Patent Application No. 10-2021-0028733, 2 pages.

* cited by examiner

LAYOUT STRUCTURE OF A FLEXIBLE CIRCUIT BOARD

FIELD OF THE INVENTION

This invention relates to a flexible circuit board, and more particularly to a layout structure of a flexible circuit board.

BACKGROUND OF THE INVENTION

As shown in FIG. 1, a conventional flexible circuit board 200 includes a flexible substrate 210, a chip 220 and a circuit layer 230, the chip 220 and the circuit layer 230 are located on a top surface 211 of the flexible substrate 210. The circuit layer 230 is composed of many fine circuit lines used for electrical connection of the chip 220 to external electronic components. With reference to FIG. 2, an edge of the chip 220 is presented as the horizontal line 220 in the drawing. The chip 220 includes a first bump 221 and a second bump 222, the circuit layer 230 includes a first inner lead 231 and a second inner lead 232 that are electrically connected to the first bump 221 and the second bump 222, respectively. If the space between the first bump 221 and the second bump 222 is large and has no additional bumps therein, the area between the first bump 221 and the second bump 222 is blank and has less support. As a result, the first inner lead 231 and the second inner lead 232 on the flexible substrate 210 may be pulled to be creased or broken due to significant temperature variation generated from the chip 220 as the chip 220 is thermal-bonded to the flexible substrate 210.

SUMMARY

One object of the present invention is to provide a first dummy lead and a second dummy lead to support a first inner lead and a second inner lead so as to prevent the first inner lead and the second inner lead from creasing or breaking during flip chip bonding.

A layout structure of flexible circuit board of the present invention includes a flexible substrate, a chip and a circuit layer. A chip mounting area and a circuit area are defined on a top surface of the flexible substrate, the circuit area surrounds the chip mounting area. The chip is mounted on the chip mounting area and includes a first bump and a second bump. A space of greater than 200 um exists between the first bump and the second bump, and there are no additional bumps between the first bump and the second bump. The circuit layer includes a first inner lead, a second inner lead, a first dummy lead, a second dummy lead, a transmission portion and a stress release portion. The first inner lead, the second inner lead, the first dummy lead and the second dummy lead are located on the chip mounting area. The first inner lead is connected to the first bump, the first dummy lead is connected to the first inner lead and adjacent to the first bump, the second inner lead is electrically connected to the second bump, the second dummy lead is connected to the second inner lead and adjacent to the second bump. The transmission portion and the stress release portion are located on the circuit area. The transmission portion is electrically connected to the first inner lead and the second inner lead. The stress release portion is connected to the transmission portion, is located between the transmission portion and an edge of the chip, and is a comb-shaped structure.

The first inner lead and the second inner lead of the present invention are protected from creasing or breaking during flip chip bonding because they are supported by the first dummy lead and the second dummy lead and the stress concentration on the transmission portion is released by the stress release portion. Accordingly, the production yield rate of the flexible circuit board of the present invention can be increased.

DETAILED DESCRIPTION OF THE INVENTION

Figure 1:
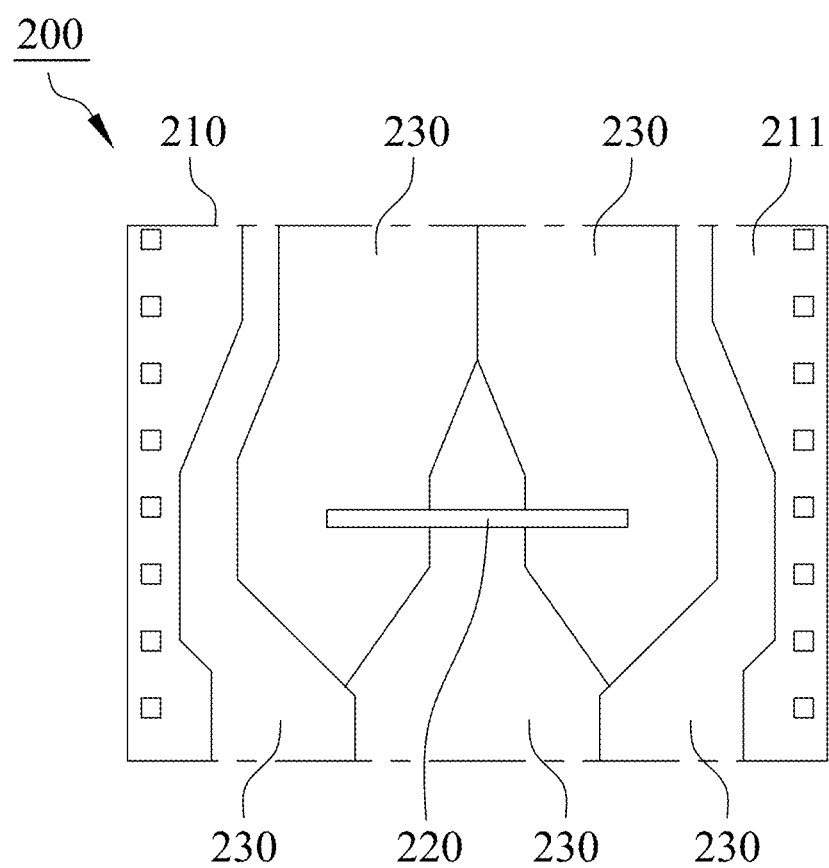
FIG. 1 is a top-view diagram illustrating a conventional flexible circuit board.
Figure 2:
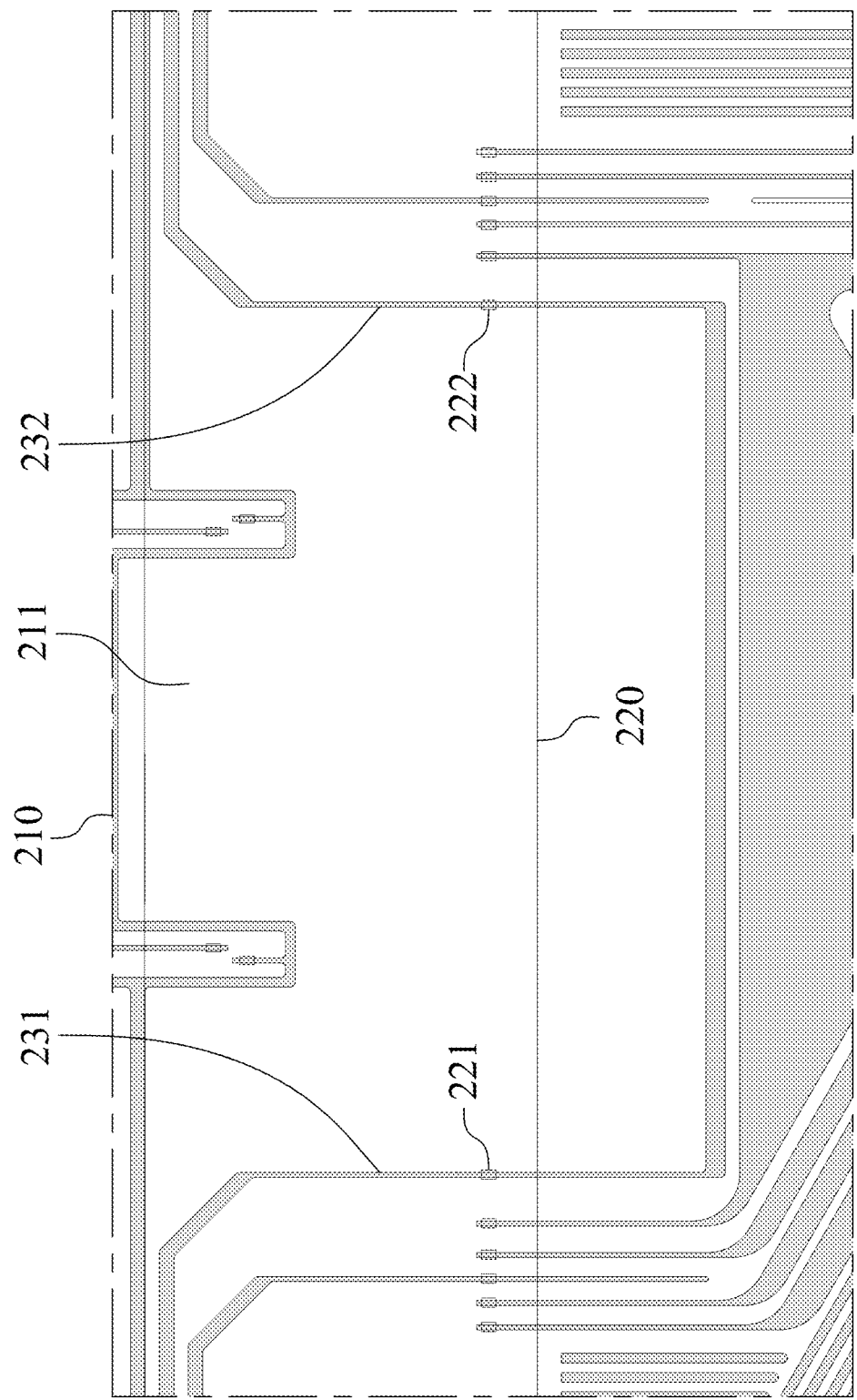
FIG. 2 is a partial enlarged diagram illustrating the conventional flexible circuit board.
Figure 3:
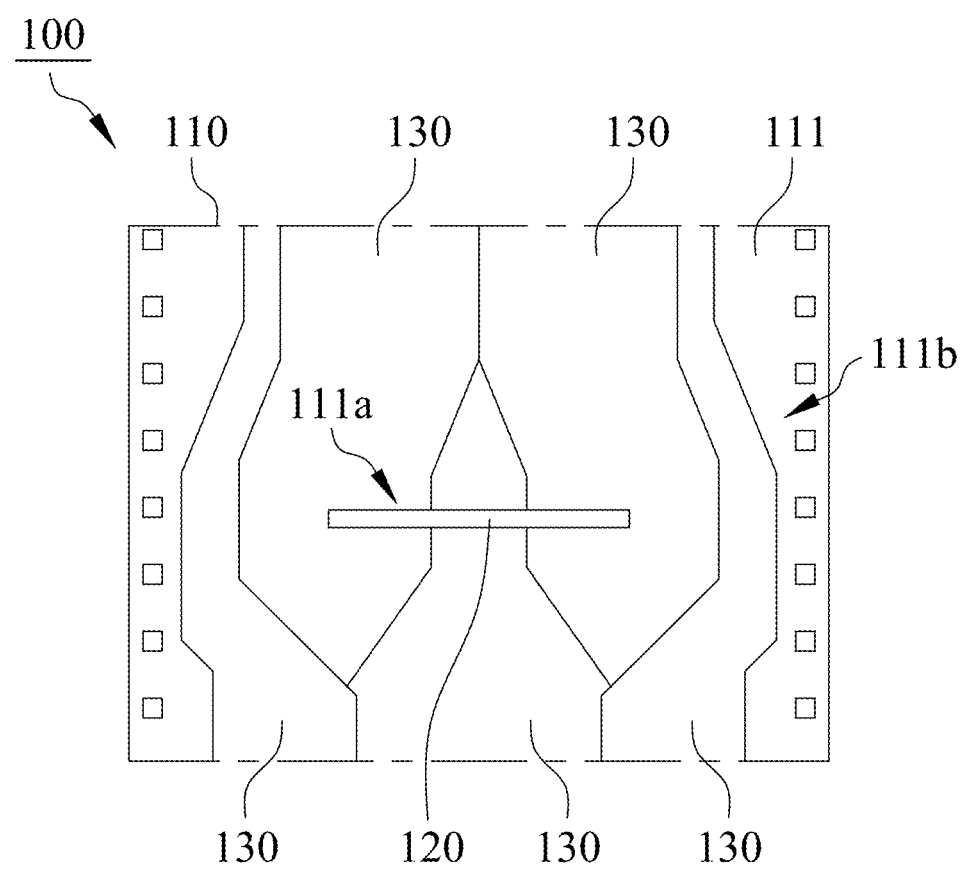
FIG. 3 is a top-view diagram illustrating a flexible circuit board in accordance with one embodiment of the present invention.

With reference to FIG. 3, a flexible circuit board 100 in accordance with one embodiment of the present invention includes a flexible substrate 110, a chip 120 and a circuit layer 130. The chip 120 and the circuit layer 130 are disposed on a top surface 111 of the flexible substrate 110. The area for the mounting of the chip 120 on the top surface 111 is defined as a chip mounting area 111a, and the area except the chip mounting area 111a on the top surface 111 is defined as a circuit area 111b. The circuit area 111b surrounds the chip mounting area 111a.

Figure 4:
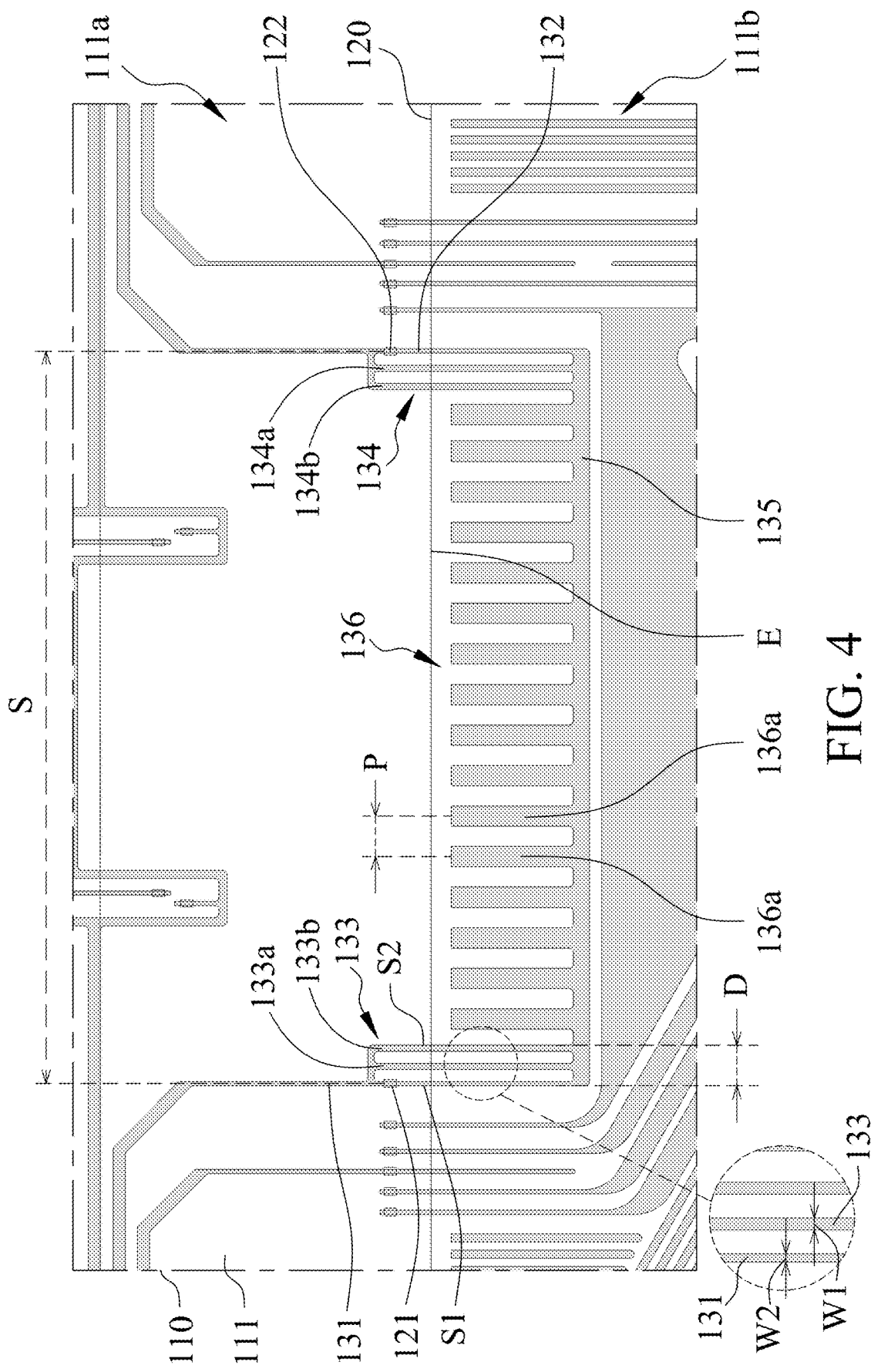
FIG. 4 is a partial enlarged diagram illustrating the flexible circuit board in accordance with one embodiment of the present invention.

With reference to FIG. 4, the chip 120 is flip-mounted on the flexible substrate 110 and eutectic bonded to the circuit layer 130 by thermal compression. The chip 120 includes a first bump 121 and a second bump 122. A space S greater than 200 um exists between the first bump 121 and the second bump 122, and there are no additional bumps between the first bump 121 and the second bump 122.

The circuit layer 130 is formed by etching a copper layer laminated or plated on the flexible substrate 110. In this embodiment, the circuit layer 130 includes a first inner lead 131, a second inner lead 132, a first dummy lead 133 and a second dummy lead 134, all of them are located on the chip mounting area 111a. The first inner lead 131 is electrically connected to the first bump 121, and the first dummy lead 133 is connected to the first inner lead 131 and adjacent to the first bump 121. The second inner lead 132 is electrically connected to the second bump 122, and the second dummy lead 134 is connected to the second inner lead 132 and adjacent to the second bump 122. Preferably, the first dummy lead 133 and the second dummy lead 134 are located between the first inner lead 131 and the second inner lead 132 to fill the gap between the first inner lead 131 and the second inner lead 132.

With reference to FIG. 4, the first dummy lead 133 and the second dummy lead 134 not connected to bumps have less heat exposure during thermal compression bonding of flip chip package so as to reduce the amount of deformation of the flexible substrate 110 nearby the first inner lead 131 and the second inner lead 132 and further protect the first inner lead 131 and the second inner lead 132 from creasing or breaking in thermal compression bonding process.

In this embodiment, the first dummy lead 133 has a first segment 133a and a second segment 133b that are connected to the first inner lead 131, the first segment 133a is located between the first inner lead 131 and the second segment 133b. The first segment 133a and the second segment 133b are arranged parallel to the first inner lead 131. A distance D of less than 0.1 mm exists between a first side S1 of the first inner lead 131 and a second side S2 of the second segment 133b of the first dummy lead 133 such that the first dummy lead 133 is close to the first inner lead 131 to provide better support. In this embodiment, the second dummy lead 134 has a third segment 134a and a fourth segment 134b that are connected to the second inner lead 132 and arranged parallel to the second inner lead 132. The third segment 134a is located between the second inner lead 132 and the fourth segment 134b. The distance between the sides of the second inner lead 132 and the fourth segment 143b is also less than 0.1 mm, consequently, the second dummy lead 134 is adjacent to the second inner lead 132 to provide better support.

In addition, a first width W1 of the first dummy lead 133 and the second dummy lead 134 is between 0.5 and 3 times a second width W2 of the first inner lead 131 and the second inner lead 132 so as to further enhance the support of the first dummy lead 133 and the second dummy 134.

With reference to FIG. 4, the first dummy lead 133 and the second dummy lead 134 of this embodiment are provided to help the first inner lead 131 and the second inner lead 132 to resist pulling force generated during bonding the chip 120 to the flexible substrate 110 such that the first inner lead 131 and the second inner lead 132 can be prevented from being creased or broken.

With reference to FIG. 4, the circuit layer 130 of this embodiment further includes a transmission portion 135 and a stress release portion 136 which are located on the circuit area 111b. The transmission portion 135 is electrically connected to the first inner lead 131 and the second inner lead 132. The stress release portion 136, a comb-shaped structure, is connected to the transmission portion 135 and located between the transmission portion 135 and an edge E of the chip 120. In this embodiment, the stress release portion 136 is provided to release stress from the first inner lead 131 and the second inner lead 132 so as to protect the first inner lead 131 and the second inner lead 132 from damage caused by stress concentration.

In this embodiment, the stress release portion 136 includes many finger-like leads 136a, and a pitch P between two adjacent finger-like leads 136a is greater than or equal to 16 um. As a result, the copper clad area nearby the edge E of the chip 120 is reduced to release stress. The finger-like leads 136a preferably do not extend into the chip mounting area 111a such that the underfill can flow between the chip 120 and the top surface 111 easily.

The first inner lead 131 and the second inner lead 132 of the present invention are supported by the first dummy lead 133 and the second dummy lead 134, and the stress release portion 136 is provided to reduce the influence of the transmission portion 135, as a result, the first inner lead 131 and the second inner lead 132 are prevented from being creased or broken during thermal compression bonding to enhance manufacturing yield of the flexible circuit board 100 of the present invention.

While this invention has been particularly illustrated and described in detail with respect to the preferred embodiments thereof, it will be clearly understood by those skilled in the art that is not limited to the specific features shown and described and various modified and changed in form and details may be made without departing from the scope of the claims.

What is claimed is:

1. A layout structure of flexible circuit board comprising:
a flexible substrate including a top surface, a chip mounting area and a circuit area are defined on the top surface, and the circuit area surrounds the chip mounting area;
a chip mounted on the chip mounting area and including a first bump and a second bump, a space greater than 200 um exists between the first bump and the second bump, and there are no additional bumps disposed between the first bump and the second bump; and
a circuit layer including a first inner lead, a second inner lead, a first dummy lead, a second dummy lead, a transmission portion and a stress release portion, the first inner lead, the second inner lead, the first dummy lead and the second dummy lead are located on the chip mounting area, the first inner lead is electrically connected to the first bump, the first dummy lead is connected to the first inner lead and adjacent to the first bump, the second inner lead is electrically connected to the second bump, the second dummy lead is connected to the second inner lead and adjacent to the second bump, the transmission portion and the stress release portion are located on the circuit area, the transmission portion is electrically connected to the first inner lead and the second inner lead, the stress release portion is connected to the transmission portion and located between the transmission portion and an edge of the chip, wherein the stress release portion is a comb-shaped structure.

2. The layout structure of flexible circuit board in accordance with claim 1, wherein the first dummy lead and the second dummy lead are not connected to any bumps.

3. The layout structure of flexible circuit board in accordance with claim 1, wherein the first dummy lead and the second dummy lead are located between the first inner lead and the second inner lead.

4. The layout structure of flexible circuit board in accordance with claim 1, wherein the first dummy lead includes a first segment and a second segment that are connected to the first inner lead, the first segment is located between the first inner lead and the second segment, the first inner lead, the first segment and the second segment are parallel to each other.

5. The layout structure of flexible circuit board in accordance with claim 4, wherein a distance of less than 0.1 mm exists between a first side of the first inner lead and a second side of the second segment of the first dummy lead.

6. The layout structure of flexible circuit board in accordance with claim 5, wherein the second dummy lead includes a third segment and a fourth segment that are connected to the second inner lead, the third segment is located between the second inner lead and the fourth segment, the second inner lead, the third segment and the fourth segment are parallel to each other.

7. The layout structure of flexible circuit board in accordance with claim 4, wherein the second dummy lead includes a third segment and a fourth segment that are connected to the second inner lead, the third segment is located between the second inner lead and the fourth segment, the second inner lead, the third segment and the fourth segment are parallel to each other.

8. The layout structure of flexible circuit board in accordance with claim 1, wherein the stress release portion includes a plurality of finger-like leads, and a pitch between two adjacent of the plurality of finger-like leads is greater than or equal to 16 um.

9. The layout structure of flexible circuit board in accordance with claim 8, wherein the plurality of finger-like leads do not extend into the chip mounting area.

10. The layout structure of flexible circuit board in accordance with claim 1, wherein a first width of the first dummy lead and the second dummy lead is between 0.5 and 3 times a second width of the first inner lead and the second inner lead.

* * * * *